(12) United States Patent
Tanguileg

(10) Patent No.: US 10,520,144 B1
(45) Date of Patent: Dec. 31, 2019

(54) LINEAR LED LIGHTING WITH ADHESIVE WINGS

(71) Applicant: Elemental LED, Inc., Reno, NV (US)

(72) Inventor: Olivia M. Tanguileg, Reno, NV (US)

(73) Assignee: Elemental LED, Inc., Reno, NV (US)

( * ) Notice: Subject to any disclaimer, the term of this patent is extended or adjusted under 35 U.S.C. 154(b) by 0 days.

(21) Appl. No.: 16/567,418

(22) Filed: Sep. 11, 2019

Related U.S. Application Data

(63) Continuation of application No. 16/130,094, filed on Sep. 13, 2018.

(51) Int. Cl.
| | | |
|---|---|---|
| *F21S 4/22* | (2016.01) | |
| *H05K 1/18* | (2006.01) | |
| *F21V 23/06* | (2006.01) | |
| *F21V 23/00* | (2015.01) | |
| *F21Y 115/10* | (2016.01) | |
| *F21Y 103/10* | (2016.01) | |

(52) U.S. Cl.
CPC .............. *F21S 4/22* (2016.01); *F21V 23/005* (2013.01); *F21V 23/06* (2013.01); *H05K 1/189* (2013.01); *F21Y 2103/10* (2016.08); *F21Y 2115/10* (2016.08); *H05K 2201/1006* (2013.01); *H05K 2201/10106* (2013.01); *H05K 2201/10522* (2013.01)

(58) Field of Classification Search
USPC .......................................................... 361/748
See application file for complete search history.

(56) References Cited

U.S. PATENT DOCUMENTS

| | | |
|---|---|---|
| 9,239,136 B1 | 1/2016 | Petersen et al. |
| 9,285,088 B2 | 3/2016 | Rolfes et al. |
| 9,371,986 B2 | 6/2016 | Nelson |
| 9,784,421 B1 | 10/2017 | Petersen et al. |
| 10,028,345 B2 | 7/2018 | Petersen et al. |
| 2011/0007482 A1 | 1/2011 | Takada et al. |
| 2012/0206914 A1* | 8/2012 | Oza ........................... F21V 7/00 362/235 |
| 2017/0367158 A1* | 12/2017 | Petersen ............ H05B 33/0827 |

* cited by examiner

*Primary Examiner* — Andargie M Aychillhum
(74) *Attorney, Agent, or Firm* — United IP Counselors, LLC

(57) ABSTRACT

An elongate, flexible printed circuit board (PCB) has a central section that carries LED light engines and other components, and a pair of wings, one on each side of the central section, adjacent to the central section. The wings carry adhesive to secure the PCB to a substrate, and may be separated from the central section in some cases by fold or score lines. The LED light engines may be positioned on a first side of the PCB and electrically connected to one or more components on a second side of the PCB. Taken together, the wings may have the same width as the central section, or they may have a greater width.

16 Claims, 4 Drawing Sheets

LINEAR LED LIGHTING WITH ADHESIVE WINGS

CROSS-REFERENCE TO RELATED APPLICATIONS

This application is a continuation of U.S. application Ser. No. 16/130,094, filed on Sep. 13, 2018. The entire contents of that application are incorporated by reference in their entirety.

BACKGROUND OF THE INVENTION

1. Field of the Invention

The invention relates to printed circuit board arrangements, and particularly to printed circuit board arrangements for linear lighting.

2. Description of Related Art

Lighting based on light-emitting diode (LED) light engines has supplanted incandescent and fluorescent fixtures as the most popular and fastest-growing type of lighting for both residential and commercial applications. The term "linear lighting" refers to a class of LED lighting in which LED light engines are disposed on a long, narrow printed circuit board (PCB) at a regular pitch, sometimes along with other circuit components. The PCB in question may be either rigid or flexible. Linear lighting may have essentially any width, and widths ranging from 5 mm to 14 mm are becoming standard in the industry. Long lengths of linear lighting may be created by electrically and mechanically connecting shorter strips of PCB at defined, overlapping solder joints.

A typical strip of linear lighting with a number of LED light engines is shown in FIG. 11 of U.S. Pat. No. 9,239,136, the contents of which are incorporated by reference in their entirety. A typical LED light engine comprises the LED itself, usually a blue-emitting LED, installed within a plastic package that is topped with a phosphor. The phosphor absorbs the narrow-spectrum blue light from the LED and emits broader spectrum light with whatever color characteristics are required. This type of light engine is sometimes referred to as a "blue pump" light engine.

Depending on the way in which the linear lighting is driven (i.e., powered), additional components may be required on the PCB. For example, if the linear lighting is driven with a power supply that produces a constant current, no additional circuit components may be required. However, it is advantageous to drive certain types of linear lighting using a constant voltage power supply that produces a current that varies with the load. In that case, additional circuit components, like resistors and current controllers, may be required to control the current.

Typically, additional components, like resistors and current controllers, are placed on the PCB between the LED light engines. This works well for small, surface-mount components. However, circuit designs for linear lighting are becoming more complex. For example, U.S. Pat. Nos. 9,784,421 and 10,028,345, the contents of both of which are incorporated by reference in their entireties, describe linear lighting that takes high voltage, alternating current (AC) power as input and converts to direct current power on the PCB to power the LED light engines. Designs like this often require more components and finding space for those components on the PCB can be difficult.

SUMMARY OF THE INVENTION

One aspect of the invention relates to linear LED lighting. In linear LED lighting according to this aspect of the invention, LED light engines are disposed on a first side of a flexible printed circuit board (PCB). Other circuit components may be disposed on the second side of the PCB. Vias or other such layer interconnects place conductive circuit traces on both sides of the PCB in electrical contact with one another. The linear lighting may operate at high- or low-voltage, and particularly if it operates at high voltage, it may be fully encapsulated within a covering that is at least translucent.

Another aspect of the invention also relates to linear LED lighting. In linear LED lighting according to this aspect of the invention, two separate PCBs are joined together back-to-back electrically and mechanically such that they interoperate. Linear lighting according to this aspect of the invention also has components on the front and the back of the joined set of PCBs.

Yet another aspect of the invention relates to linear lighting designed to attach to a substrate. The central portion of the PCB of the linear lighting has components on both sides. The PCB is also widened, with lateral sections or wings that are provided with adhesive on at least one surface. The wings can thus be used to attach the linear lighting to a substrate.

Other aspects, features, and advantages of the invention will be set forth in the description that follows.

BRIEF DESCRIPTION OF THE DRAWING FIGURES

The invention will be described with respect to the following drawing figures, in which like numerals represent like features throughout the invention, and in which.

DETAILED DESCRIPTION

Figure 1:
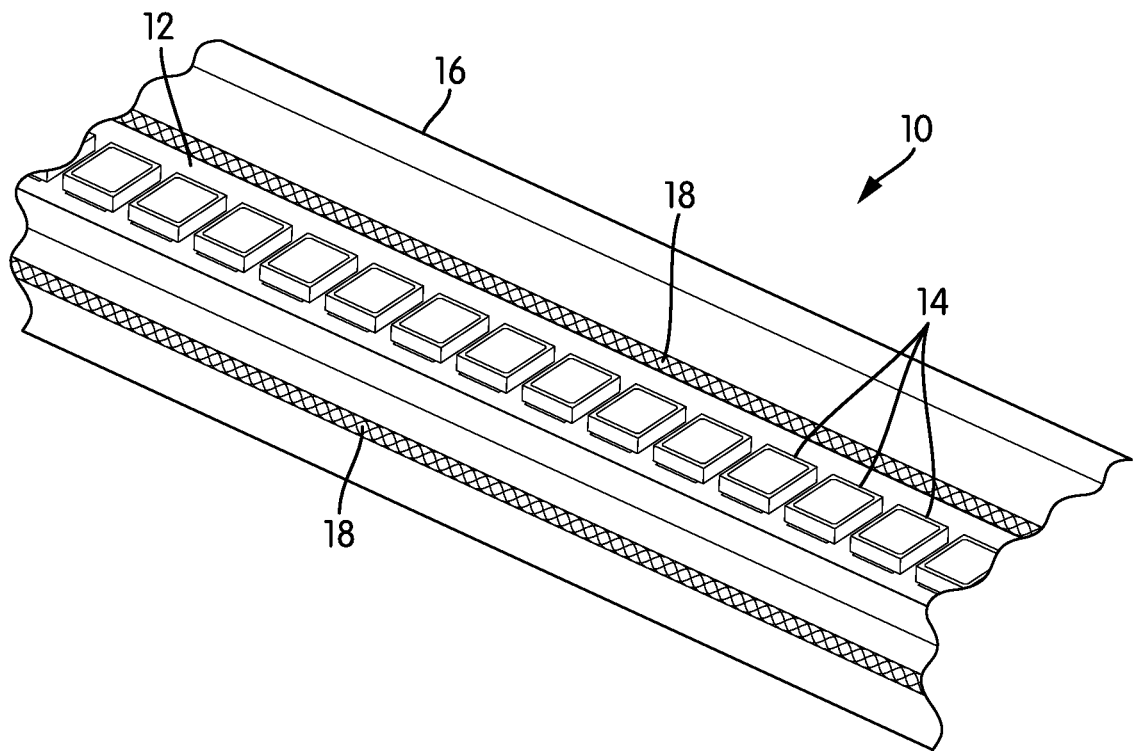
FIG. 1 is a perspective view of one side of linear lighting according to an embodiment of the present invention.

FIG. 1 is a perspective view of a strip of linear lighting, generally indicated at 10, according to one embodiment of the invention. The strip of linear lighting 10 includes a PCB 12. Disposed on the PCB 12 are a plurality of LED light engines 14 arranged at a regular spacing or pitch with respect to one another.

In general, linear lighting according to embodiments of the invention may be either low-voltage or high-voltage. While the definitions of low and high voltage tend to vary depending on the authority one consults, for purposes of this description, low voltage should be considered to be any voltage under about 50V. The strip of linear lighting 10 illustrated in FIG. 1 is high-voltage linear lighting and is intended to take household or commercial power. In the United States, that typically means 120V alternating current (AC) power for household and light commercial applications, and up to 277V for single-phase commercial applications. Other jurisdictions may be, e.g., 220-240V single phase. All alternating current voltages given here are root mean square voltages.

In the illustrated embodiment, the linear lighting 10 has a flexible covering 16 that is at least translucent and will be transparent in many embodiments. The flexible covering 16 may serve several functions. First, since the linear lighting 10 operates at high voltage, the flexible covering 16 provides electrical insulation. Second, the covering 16 may provide ingress protection against rain, dirt, and other elements. For example, presuming that the linear lighting 10 is properly sealed at its ends, the flexible covering 16 may provide an ingress protection (IP) rating of 65 or greater. The covering 16 itself may comprise multiple layers of molded or extruded material. For example, there may be an inner extrusion that surrounds the PCB 12, around which a second layer of plastic is molded or extruded. In some cases, the covering 16 may be required to carry a particular flame rating, or to have certain defined behaviors in response to spark or flame.

The PCB 12 is made of layers of a base or core material and layers of conductive material. For example, the core of the PCB 12 may be made of Mylar or polyimide, with layers of copper laminated on the core material as a conductor. In other embodiments, the PCB 12 may be either rigid or flexible. Of course, in sufficiently thin section, many materials possess the kind of flexibility that is useful in linear lighting 10, including thin sections of FR4 (i.e., glass fiber composite), aluminum, silicon, gold, carbon nanotubes, and any number of other plastics. In many cases, the outer surface of the PCB 12 may be screen printed with alignment or informational features.

As is described in U.S. Pat. No. 9,784,421, linear lighting is typically divided into repeating blocks, each of which has the components and circuitry necessary to power and drive a specific number of LED light engines. The repeating blocks are typically separable from one another, such that the linear lighting can be physically cut at specific cut points. As shown in FIG. 1, a pair of conductors 18 run the entire length of linear lighting 10 and are electrically connected to each of the repeating blocks. A repeating block for high-voltage linear lighting would typically have six or more LED light engines 14 per repeating block; a repeating block for low-voltage linear lighting would typically have 3-4 LED light engines 14 per repeating block. The conductors 18 themselves would be, e.g., 16-20 AWG braided copper wires. Typically, the conductors 18 are kept in separate compartments within the extrusion, electrically isolated from one another and from the PCB 12, except at designated connection points within each repeating block. Linear lighting 10 is a two-wire system, with line and neutral conductors 18; a separate ground wire may be added if needed.

In a traditional strip of linear lighting, such as that shown in FIG. 1 of U.S. Pat. No. 9,784,421, both the light engines and additional circuit components are located on the same side of the PCB. However, that is not necessarily the case in linear lighting 10.

Figure 2:
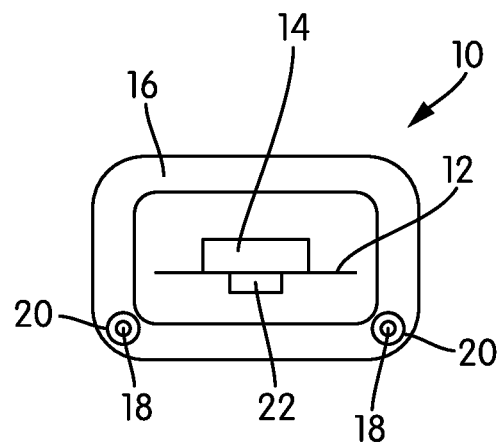
FIG. 2 is an end elevational view of the linear lighting of FIG. 1.

FIG. 2 is a cross-sectional view of linear lighting 10, taken through Line 2-2 of FIG. 1. In the view of FIG. 2, the PCB 12 is within the covering 16. The conductors 18 lie within their own channels 20 in the covering 16. As shown, the PCB 12 is double-sided. On a first side of the PCB 12, the LED light engines 14 are disposed. On the opposite side of the PCB 12, other components are mounted. In the illustrated embodiment, all of the LED light engines 14 are on one side of the PCB 12, and all of the other circuit components are on the other side of the PCB 12. Thus, in the view of FIG. 2, a component 22 is mounted on the other side of the PCB 12. The component 22 may be a resistor, a current controller, a filter or portion of a filter circuit, a network controller, or another type of component, as will be set forth in greater detail below. For convenience, some portions of this description may refer to the component 22 as a resistor.

Figure 3:
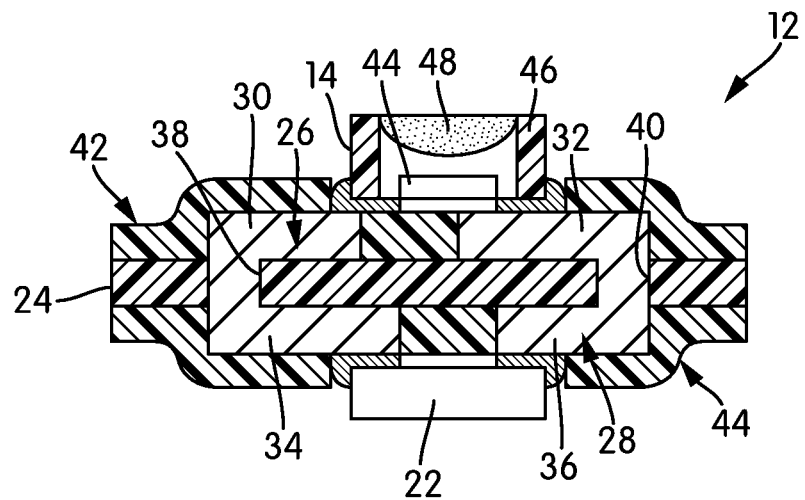
FIG. 3 is a cross-sectional view of the printed circuit board of the linear lighting of FIG. 1, shown in isolation.

FIG. 3 is a close-up cross-sectional view of the PCB 12 in isolation, illustrating the arrangement of the layers of the PCB 12. The main substrate or core layer 24 of the PCB 12 in the illustrated embodiment comprises a polyimide or Mylar plastic, although as noted above, it may be made of any number of materials. Upper and lower conductive layers 26, 28 are laminated on or otherwise adhered to the core layer 24. The conductive layers 26, 28 are typically comprised of copper, although gold, silver, aluminum, and a number of other conductors could be used in other embodiments. The conductive layers 26, 28 are patterned and etched to form conductive contact traces, to which components 14, 22 can be connected in order to receive and transmit power and other signals. Linear lighting that uses single color LED light engines typically has two conductive traces on each side of the PCB 12, one for power and one for neutral. Linear lighting that uses multi-color (e.g., red-green-blue; RGB) light engines may have five or six conductive traces on each side of the PCB 12. In some cases, additional traces may be provided in order to carry data signals that control or determine dimming levels and other characteristics.

PCB 12 of FIG. 3 has two conductive traces on each side: conductive traces 30 and 32 are on the upper side of PCB 12, while conductive traces 34 and 36 are on the lower side of PCB 12. The conductive traces 30, 32, 34, 36 need not be identical to one another, and can be designed to traverse any necessary path. As those of skill in the art will appreciate, it is typically helpful if the conductive traces 30, 32, 34, 36 are as large as possible, so as to make their current-carrying capacity as large as possible.

As shown in FIG. 3, PCB 12 also has two vias 38, 40 in the substrate or core layer 24. The vias 38, 40 are filled with conductive material, typically the same material of which the conductive layers 26, 28 are made, and place the upper conductive traces 30, 32 in electrical contact with their corresponding lower conductive traces 34, 36. The vias 38, 40 may be spaced some distance from the locations where components 14, 22 are mounted, and while they are shown on opposite sides of the PCB 12 in the illustration of FIG. 3, they may be grouped together on the PCB 12 or placed in any convenient location. During the manufacturing process, the vias 38, 40 may be formed in the PCB 12 by mechanical drilling, laser cutting, punching, etching, or any other known process.

Both sides of the PCB 12 are covered with an outer layer 42, 44. The outer layer 42, 44 provides electrical insulation and may also have informational markings, e.g., denoting the spaces in which components 14, 22 are to be placed. In many production processes, the outer layer 42, 44 may be screen-printed on the conductive layers 26, 28, but other methods may be used as well. For example, the conductive layers 26, 28 may be masked with a photoresist, patterned photolithographically, and an appropriate layer deposited, dip-coated, sprayed, or placed in some other fashion. Although the conductive layers 26, 28 are shown in FIG. 3 as being largely inaccessible from the surface of the PCB 12 because of the outer layers 42, 44, typically, portions of each conductive trace 30, 32, 34, 36 would be exposed to form solder pads for making electrical connections to the PCB 12. Those solder pads may be square, round, or oval, and may be pre-tinned with solder.

FIG. 3 also illustrates the structure of one of the LED light engines 14 in cross-section. The LED light engine 14 comprises one or more LEDs 44 within a package 46 that is typically made of a plastic. The package 46 is topped with a phosphor 48. Most LED light engines 14 that produce "white" light actually use LEDs that emit blue light, e.g., at 450 nm. That blue light is absorbed by the phosphor 48 and re-emitted in a more desirable spectrum. Of course, linear lighting 10 may use any type of LED light engines, including pure-color LEDs (e.g., blue, red) and organic LEDs (OLEDs).

In the linear lighting 10 of FIGS. 1-3, the LED light engines 14 are on one side of the PCB 12 and other components, like resistors 22, are on the other side of the PCB 12. In general, though, any component may be on any side of the PCB 12. The advantage of placing components other than LED light engines 14 on the opposite side of the PCB 12 is that one can reduce the pitch of the LED light engines 14 on the first side of the PCB 12 and thus produce more light that is more continuous in appearance, with fewer of the "dark spots" that occur when LED light engines 14 are widely spaced. However, there are many ways of arranging a PCB 12 in accordance with embodiments of the invention. For example, resistors 22 and other such components could be placed adjacent to the series of LED light engines 14, rather than between individual LED light engines 14.

As another example, U.S. Pat. No. 10,028,345, the contents of which are incorporated by reference in their entirety, discloses high-voltage LED linear lighting in which power is converted from high-voltage AC to DC on the PCB. With this type of linear lighting, a number of components are used to perform the filtering functions, and with a single-sided PCB arrangement, it can be difficult to fit all of those components on the PCB without altering the pitch of the LED light engines. However, linear lighting according to that patent may be implemented with a double-sided PCB, as described here. The power conversion and filtering components may either be located on a second side of the PCB, or they may be distributed on both sides of the PCB. More specifically, the second side of the PCB may include rectifiers, capacitors, resistors, current controllers, or other such components. Broadly, in other embodiments, the components on the reverse side of the PCB may, for example, be any or all components of a switched-mode power supply.

A number of factors may dictate which side of the PCB 12 components are placed on, including conventional circuit design considerations such as the lengths and routings of conductive traces on the PCB 12, the presence of any parasitic capacitances or other deleterious effects from components that are spaced closely together, and other such considerations. However, other factors may also come into play. For example, it may be useful in some cases to place components on one side of the PCB 12 or the other in order to balance the weight of the components on each side of the PCB 12. It may also be helpful to consider the placement of components on one side versus the other in order to minimize the effect on the overall flexibility of the linear lighting 10.

While portions of this description may focus on power conversion and filtering components as additional components that may be included in linear lighting 10, other types of components may be included as well. For example, linear lighting may include controller ICs to control RGB light engines or other kinds of light engines that emit more than one color or kind of light; Bluetooth controllers; WiFi transceivers; and any other type of circuit component that controls LED light engines or allows the linear lighting to interface with networks or other types of devices. For example, communication networks based on high-frequency switching of LED light engines have been described. These networks typically function by encoding data in light patterns, using rapidly switched LED light engines to transmit that data, and using a photosensor to detect and receive the data. Switching elements necessary to encode or multiplex data or to switch LED light engines, and sensors necessary to detect incoming data and decode or demultiplex data may also be included.

Figure 4:
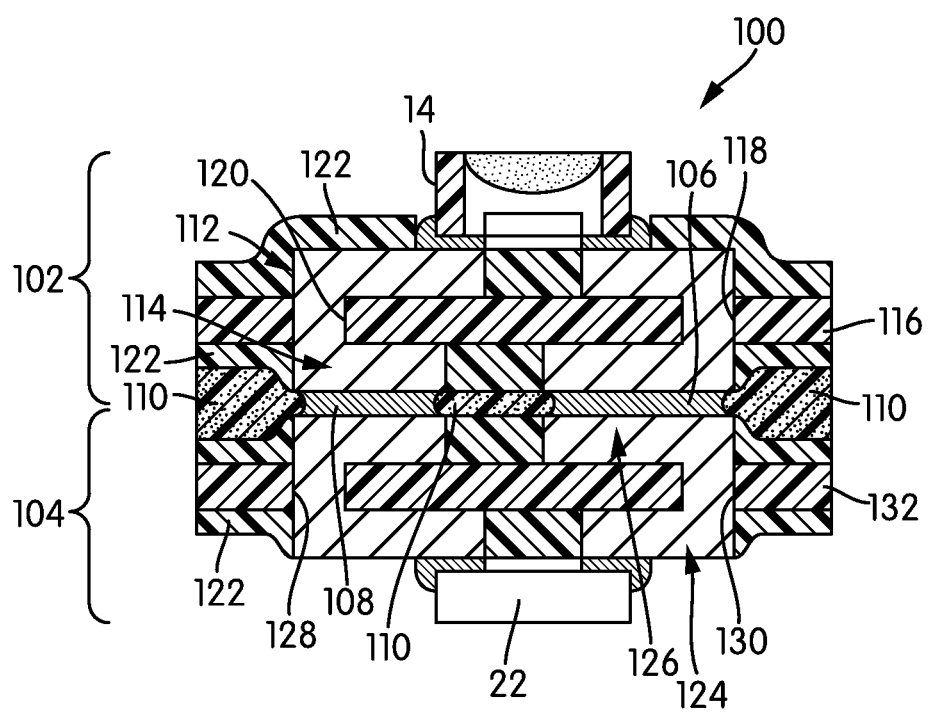
FIG. 4 is a cross-sectional view of a printed circuit board of linear lighting according to another embodiment of the invention.

In the linear lighting 10 of FIGS. 1-3, components 14, 22 are placed on both sides of a single substrate PCB 12. However, linear lighting according to embodiments of the invention need not rely solely on one PCB. FIG. 4 is a cross-sectional view of linear lighting, generally indicated at 100, in which there are two PCBs 102, 104 that are positioned back to back, joined mechanically and electrically, in this case by solder 106, 108 and adhesive 110, to form a single unit. The effect is roughly the same as in linear lighting 10; in linear lighting 100, some components are on one side and other components are on the other side.

More specifically, PCB 102 is the upper PCB in the illustration of FIG. 4. An LED light engine 14 is surface-mounted on the PCB 102. PCB 102 has an upper conductive layer 112 and a lower conductive layer 114 that are laminated on a core substrate 116. The substrate 116 has vias 118, 120 that place the upper conductive layer 112 in electrical contact with the lower conductive layer 114. As shown, the upper and lower conductive layers 112, 114 are patterned into conductive traces for making electrical connections. Typically, an outer layer 122 would be formed on the top of the PCB 102 and may also be formed on the bottom of the PCB 102, or portions of it.

The bottom PCB 104 is of similar construction, except that its conductive layers 124, 126 may be patterned differently to accommodate the needs of different components 22. Vias 128, 130 may also be located in different locations on the core substrate layer 132 than the vias 118, 120 of the upper PCB 102, and there may be more or fewer of them. Otherwise, the bottom PCB 104 has the same basic layer structure as the upper PCB 102, although that need not be the case in all embodiments, and in other embodiments, the two PCBs 102, 104 may differ radically in structure.

Figure 5:
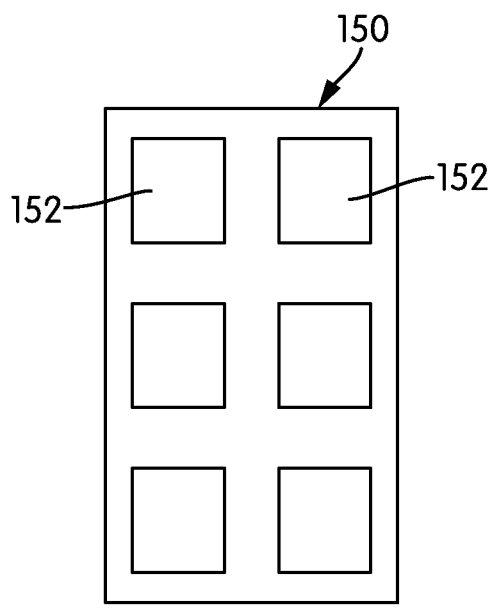
FIG. 5 is a bottom plan view of a printed circuit board illustrating its solder pads.
Figure 6:
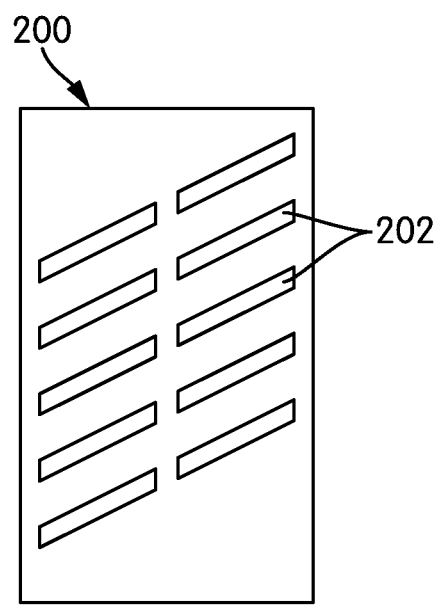
FIG. 6 is a bottom plan view of a printed circuit board according to another embodiment of the invention, illustrating its solder pads.

The solder pads that connect one PCB 102, 104 to the other may vary in layout and configuration. FIGS. 5 and 6 are plan views of the undersides of PCBs, illustrating different possible solder pad layouts. In PCB 150 of FIG. 5, the solder pads 152 are large and rectangular. By contrast, in PCB 200 of FIG. 6, the solder pads 202 are more elongate, and extend diagonally across the PCB 200.

In a typical embodiment, the solder pads 152, 202 may be tinned or otherwise provided with raised areas of solder. For example, solder paste may be applied to the pads 152, 202 and the PCBs 150, 200 sent through a reflow oven. The areas around the solder pads 152, 202 may be provided with adhesive, so that two PCBs 102, 104 are connected electrically by the solder pads and mechanically by adhesive. The advantages of this arrangement using two PCBs 102, 104 may lie in modularity and ease of production. Since there are two PCBs 102, 104, each PCB 102, 104 may be produced separately using, e.g., a single-sided surface-mount process, and the two PCBs 102, 104 can be joined easily later. In some cases, if the solder pads 152, 202 are tinned or provided with raised areas of solder, it may not be necessary to heat or reflow the solder to create an electrical connection; rather, it may be sufficient simply to place corresponding solder pads 152, 202 from the two PCBs 102, 104 in physical contact with one another using an adhesive.

The advantage of an arrangement with multiple PCBs 102, 104 like that shown in FIG. 4 is that one PCB 102 can serve as the PCB 102 that holds the LED light engines 14 and the other PCB 104 can house the components that drive or control those LED light engines 14. This allows the piece of linear lighting 100 to be easily adapted for different applications simply by changing the "control/drive" PCB 104 that houses those components. This "interchangeable parts" approach would, for example, allow one to create a version of linear lighting 100 with a "control/drive" PCB 104 that converts high-voltage AC power to low-voltage DC power and supplies it to the LED light engines 14 and another version with a "control/drive" PCB 104 that uses the same low-voltage DC LED light engines 14 and the same upper PCB 102 but instead operates with low-voltage DC and has network interface and control components instead of power conversion and filtering components.

While FIGS. 5 and 6 show various patterns of solder pads 152, 202, the two PCBs 102, 104 need not be electrically connected at all of these solder pads 152, 202. Instead, connection at one pair or set of solder pads 152, 202 at one end of the linear lighting 100 may be sufficient. Thus, only one set of solder pads 152, 202 on each side may be used for electrical connection, while adhesive provides mechanical connection for the remainder of the length of the linear lighting 100. However, it is helpful if solder pads 152, 202 of common characteristics and layout are provided on both PCBs 102, 104 at regular intervals in order to ensure that there are as many possible points of connection as possible.

In some embodiments, the two PCBs 102, 104 may be of the same length and may be secured back-to-back over their entire lengths. However, while that arrangement may be neat and convenient in many cases, it need not always be the case. The second or "control/drive" PCB 104 need not extend the full length of the PCB 102 that includes the LED light engines 14. For example, if the PCB 104 carries network interface components, it may only need to extend a few inches to fit all of the necessary components, whereas the PCB 102 that includes the LED light engines 14 may extend several feet or meters. In that case, it is not necessary for the PCB 104 to extend the entire length of the PCB 102. It is also not necessary for the PCB 104 to align perfectly or to be in perfect registration with the PCB 102, so long as one makes electrical contact with the other and the two are mechanically secured together.

Typical linear lighting can be easily backed by a layer of adhesive, turning it into so-called tape light that can be mounted virtually anywhere. That same objective can be achieved by applying adhesive to the underside of the covering 16 in linear lighting 10 that has a covering. However, if the linear lighting in question has no covering 16 and the PCB in question has components on both sides, then the question of how to apply adhesive becomes more difficult.

Figure 7:
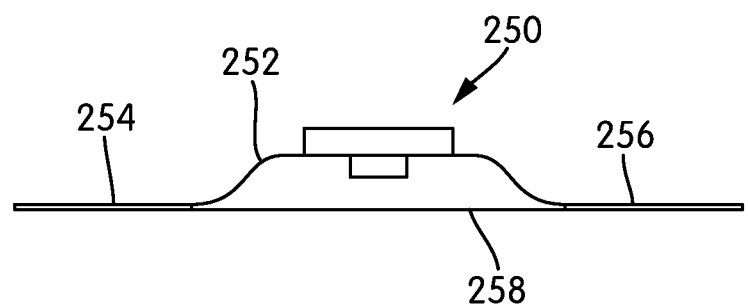
FIG. 7 is an end elevational view of linear lighting according to yet another embodiment of the invention.

FIG. 7 is an end-elevational view of a strip of linear lighting, generally indicated at 250, according to yet another embodiment of the invention. The linear lighting 250 has a wider PCB 252 than comparable linear lighting 10, 100. For example, if the functional width of a PCB used in linear lighting would be 8 mm, the total width of the PCB 252 might be 16 mm or 24 mm—i.e., 100%, 200%, or even 300% wider than needed to carry circuit elements.

In the illustrated embodiment, the additional width does not have circuit components mounted on it; rather, it serves as a pair of flexible lateral wings 254, 256. The wings 254, 256 may be pre-creased at appropriate locations and typically have adhesive on their undersides. The adhesive itself may be protected by a tear-away backing. The wings 254, 256 and their adhesive serve to attach the PCB 252 to a substrate 258, as shown in FIG. 7.

The precise characteristics of the wings 254, 256 will vary from embodiment to embodiment. Adhesive may be provided on either side of the wings 254, 256. In many cases, the LED light engines 260 will be placed on the PCB 252 on the side opposite the side on which the adhesive is provided. However, in some cases, it may be useful if the wings 254, 256 have adhesive on the same side as that on which the LED light engines 260 are mounted, e.g., if the linear lighting 250 is to be attached to a transparent or translucent substrate through which the LED light engines 260 are intended to emit light.

In the embodiment of FIG. 7, the wings 254, 256 are comprised of the core or substrate material of the PCB 252 and are not laminated with conductive layers or covered with an outer layer. However, in other embodiments, the arrangement may be different. If desired, the sides of the wings 254, 265 that are not covered with adhesive may be provided with a conductive layer and adapted to receive surface-mount components.

Figure 8:
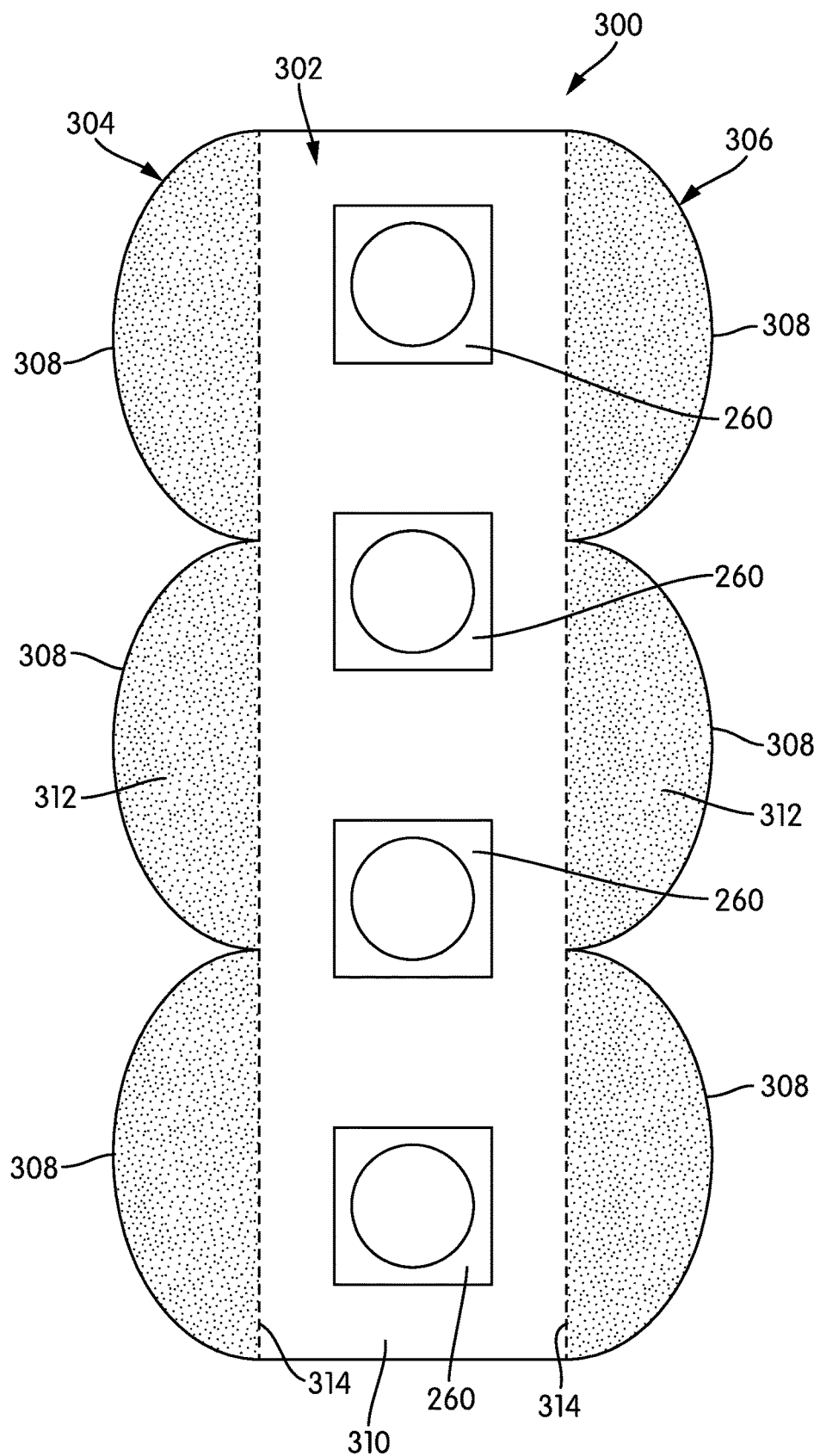
FIG. 8 is a top plan view of linear lighting with attachment wings.

FIG. 8 is a top plan view of linear lighting, generally indicated at 300, that is a variation on the wing concept described above. The linear lighting 300 has a PCB 302 on which a number of LED light engines 260 are provided. There are no current control or drive components on the PCB 302 in the view of FIG. 8; those components may either be attached on the reverse side of the PCB 302, or there may be no need for such components, e.g., if the linear lighting 300 is designed for use with a low-voltage, constant-current driver.

The wings 304, 306 of linear lighting 300 comprise a series of curved tabs 308 that extend outwardly from the central portion 310 of the PCB 302. The tabs 308 each have adhesive 312 on their upper faces. The adhesive 312 would typically be protected by a plastic or wax strip that would be removed just before application, but for the sake of clarity, none is present in FIG. 8. In the illustrated embodiment, the wings 304, 306 are separated from the central portion 310 of the PCB 302 by score or fold lines that allow the wings 304, 306 to fold or bend relative to the central portion 310.

In FIG. 8, the PCB 302 is approximately twice as wide as a comparably-featured strip of linear lighting would be. In other words, the central portion 310 of the PCB 302 has approximately the same width as both wings 304, 306 taken together. However, as was described above, the proportions of the wings 304, 306 may vary. Additionally, although the wings 304, 306 are symmetrical and the tabs 308 are all the same size and shape, they need not be in other embodiments. The wings 304, 306 may be cut into the shapes of the tabs 308 by die cutting, laser cutting, or some other form of cutting as a finishing step after the LED light engines 260 are mounted. The number of tabs 308 may vary considerably from one embodiment to the next; in some embodiments, there may be only one or two tabs per unit length of linear lighting.

It should be understood that although the use of wings 254, 256, 304, 306 that carry adhesive may be particularly useful with double-sided PCBs 250, 300 that carry components on both sides, single-sided PCBs could also have wings.

While the invention has been described with respect to certain embodiments, the description is intended to be exemplary, rather than limiting. Modifications and changes may be made within the scope of the invention, which is defined by the appended claims.

What is claimed is:

1. Linear lighting, comprising: an elongate, flexible printed circuit board (PCB) having a central area and a pair of wings disposed along respective sides of the central area, each of the pair of wings having adhesive disposed on a first side or a second side thereof, and a plurality of LED light engines disposed on a first side of the PCB within the central area, the plurality of LED light engines being spaced along a length of the PCB; wherein the central area does not include the adhesive, wherein the pair of wings are separated from the central section of the PCB by fold or score lines.

2. The linear lighting of claim 1, further comprising one or more components disposed on a second side of the PCB, opposite the first side, the one or more components being electrically connected to the first side of the PCB.

3. The linear lighting of claim 1, wherein the pair of wings, taken together, have a width equal to a width of the central area.

4. The linear lighting of claim 1, wherein the pair of wings, taken together, have a width greater than the width of the central area.

5. The linear lighting of claim 1, wherein each of the pair of wings is divided into two or more tabs.

6. The linear lighting of claim 1, wherein the elongate, flexible PCB comprises a base layer and one or more conductive layers.

7. The linear lighting of claim 6, wherein the pair of wings are formed of the base layer.

8. Linear lighting, comprising: an elongate, flexible printed circuit board (PCB) having a central area and a pair of wings disposed along respective sides of the central area, each of the pair of wings having adhesive disposed on a first side or a second side thereof, and a plurality of LED light engines disposed on a first side of the PCB within the central area, the plurality of LED light engines being spaced along a length of the PCB; one or more components disposed on a second side of the PCB, opposite the first side, the one or more components being electrically connected to the first side of the PCB; wherein the central area does not include the adhesive, wherein the pair of wings are separated from the central section of the PCB by fold or score lines.

9. The linear lighting of claim 8, wherein the pair of wings, taken together, have a width equal to a width of the central area.

10. The linear lighting of claim 8, wherein the pair of wings, taken together, have a width greater than the width of the central area.

11. The linear lighting of claim 8, wherein each of the pair of wings is divided into two or more tabs.

12. The linear lighting of claim 8, wherein the elongate, flexible PCB comprises a base layer and one or more conductive layers.

13. The linear lighting of claim 8, wherein the pair of wings are formed of the base layer.

14. The linear lighting of claim 8, wherein the one or more components disposed on the second side of the PCB comprise power or control components for the plurality of LED light engines.

15. The linear lighting of claim 14, wherein the one or more components disposed on the second side of the PCB comprise a filter.

16. The linear lighting of claim 14, wherein the one or more components disposed on the second side of the PCB comprise a resistor, a current controller, a color controller, or a network interface.

* * * * *